United States Patent
Florian et al.

(10) Patent No.: US 7,723,902 B2
(45) Date of Patent: May 25, 2010

(54) PIEZOELECTRIC TRANSFORMER AND METHOD FOR THE PRODUCTION THEREOF

(75) Inventors: Heinz Florian, Bad Gams (AT); Reinhard Gabl, St. Peter (AT); Igor Kartashev, Deutschlandsberg (AT); Patrick Schmidt-Winkel, Bad Gams (AT)

(73) Assignee: EPCOS AG, Munich (DE)

( * ) Notice: Subject to any disclaimer, the term of this patent is extended or adjusted under 35 U.S.C. 154(b) by 148 days.

(21) Appl. No.: 12/089,076

(22) PCT Filed: Sep. 29, 2006

(86) PCT No.: PCT/DE2006/001737
§ 371 (c)(1), (2), (4) Date: Jul. 1, 2008

(87) PCT Pub. No.: WO2007/038914
PCT Pub. Date: Apr. 12, 2007

(65) Prior Publication Data
US 2009/0218916 A1    Sep. 3, 2009

(30) Foreign Application Priority Data
Oct. 4, 2005 (DE) .................. 10 2005 047 368

(51) Int. Cl.
*H01L 41/107* (2006.01)
(52) U.S. Cl. .................................................. 310/359
(58) Field of Classification Search .................. 310/359
See application file for complete search history.

(56) References Cited

U.S. PATENT DOCUMENTS

| | | | |
|---|---|---|---|
| 5,142,353 A | 8/1992 | Kageyama et al. | |
| 5,341,061 A | 8/1994 | Zaitsu | |
| 5,872,419 A | 2/1999 | Hall et al. | |
| 6,452,313 B2 | 9/2002 | Watanabe et al. | |
| 6,794,796 B2 | 9/2004 | Nakatsuka et al. | |
| 7,411,340 B2 * | 8/2008 | Florian et al. | 310/359 |
| 7,613,076 B2 * | 11/2009 | Larson et al. | 367/151 |
| 2001/0028206 A1 | 10/2001 | Watanabe et al. | |

FOREIGN PATENT DOCUMENTS

| | | |
|---|---|---|
| DE | 198 34 673 | 2/2000 |
| JP | 1-168185 | 7/1989 |
| JP | 11-168247 | 6/1999 |
| JP | 2000-114614 | 4/2000 |
| JP | 2005-217259 | 8/2005 |

OTHER PUBLICATIONS

English translation of Written Opinion for PCT/DE2006/001737.
International Search Report for PCT/DE2006/001737.
Written Opinion for PCT/DE2006/001737.

* cited by examiner

*Primary Examiner*—Thomas M Dougherty
(74) *Attorney, Agent, or Firm*—Fish & Richardson P.C.

(57) ABSTRACT

A piezoelectric transformer includes a base body. The base body includes an input part and an output part mechanically connected to the input part. The base body also includes internal electrodes perpendicular to a polarization axis of the transformer-in the input part and the output part. The transformer also includes an auxiliary electrode galvanically separated from the input part and the output part.

17 Claims, 2 Drawing Sheets

PIEZOELECTRIC TRANSFORMER AND METHOD FOR THE PRODUCTION THEREOF

CROSS REFERENCE TO RELATED APPLICATIONS

Pursuant to 35 USC §120, this application claims the benefit of PCT/DE2006/001737 filed Sep. 29, 2006 which claims the benefit of German Patent Application No. 102005047368.7 filed Oct. 4, 2005. Each of these applications is incorporated by reference in its entirety.

TECHNICAL FIELD

A piezoelectric transformer with a body that contains a piezoelectric material is disclosed.

BACKGROUND

From publication US 2001/0028206 A1, a piezoelectric transformer is known in which internal electrodes are provided in the interior of a body.

In publication U.S. Pat. No. 6,794,796 B2 describes Rosen-type piezoelectric high-voltage transformers that feature sensor electrodes.

SUMMARY

One task to be achieved consists of specifying another piezoelectric transformer in which the risk of voltage sparkover between different electric poles is reduced.

A transformer with a base body will be specified, which contains a material with piezoelectric properties, such as, e.g., a piezoceramic. A piezoelectric material can be, for example, a lead-zirconate-titanate ceramic.

The base body includes an input part and an output part connected mechanically to this input part. The two transformer parts have internal electrodes that are arranged in the base body. The transformer further includes an auxiliary electrode that is separated galvanically from the input part and from the output part and from the internal electrodes.

Here, under the inverse piezoelectric effect, it is understood that the piezoelectric ceramic, which, if necessary, still must be polarized for using the component, undergoes deformation when an electric field is applied parallel or anti-parallel or also at an angle to the polarization direction. Under the direct piezoelectric effect, it is understood that there is a voltage drop in the body when deformations occur.

In the input part of the transformer, mechanical oscillations in the body of the transformer are generated with the help of electrical voltages. In the output part, mechanical oscillations of the body are converted into electric fields that can be picked up by suitable electrodes.

According to a first preferred embodiment, at least one part of the auxiliary electrode is arranged parallel to the internal electrodes of the input part and the output part. In the base body there are internal electrodes that are perpendicular to the polarization axis of the transformer.

The polarization axis of the transformer is preferably directed along the longitudinal axis of the base body. When excited, longitudinal oscillations of the base body are excited, with mechanical vibrations propagating in the longitudinal direction of the base body both in the input part and also in the output part.

The polarization axis of the transformer, however, can also be directed in a thickness direction of the base body. When excited, thickness oscillations of the base body are excited, with mechanical vibrations propagating in the thickness direction of the base body both in the input part and also in the output part.

The part of the auxiliary electrode arranged parallel to the internal electrodes can be arranged, e.g., in the interior of the base body, and thus, it can be formed as an inner electrode. An inner auxiliary electrode is preferably connected to an auxiliary contact arranged on the surface of the base body.

At least one part of the auxiliary electrode, in one variant even the entire auxiliary electrode, can also be arranged on the surface of the base body and can be used as an auxiliary contact.

According to a second preferred embodiment, at least one part of the auxiliary electrode is arranged in the interior of the base body. In the input and output parts there are preferably also several internal electrodes that lie perpendicular to the polarization axis of the transformer. The part of the auxiliary electrode arranged in the base body is preferably arranged parallel to the internal electrodes of the input and output part.

The two preferred embodiments can be combined with each other.

In addition, advantageous configurations of the specified piezoelectric transformer according to the first and the second embodiment and also its functioning will be explained in more detail.

The internal electrodes of the input and output parts are connected to input and output contacts of the transformer that are accessible from the outside. An inner auxiliary electrode is connected conductively to at least one auxiliary contact of the transformer accessible from the outside.

The input and output contacts are in contact with the base body, wherein they are preferably arranged on its surface. Preferably, all of the external contacts of the transformer can be soldered underneath its input and output contacts and auxiliary contact.

Applying a voltage to the input contacts can cause a mechanical deformation of the body. With the help of the output contacts, an electrical voltage resulting from the deformation of the body can be picked up.

The transformer can be driven by means of a driver circuit, with an input voltage being applied to its input contacts. The transformer is distinguished in that the output voltage to be picked up at its output contacts is different from the input voltage. In particular, the output voltage can be greater than the input voltage. However, the output voltage can also be smaller than the input voltage. The transformer is also preferably distinguished in that a control voltage to be picked up at the auxiliary contact differs from the input and output voltage of the transformer. This control voltage can be used in a feedback circuit for monitoring the driver circuit that drives the transformer. Therefore, because the auxiliary electrode is decoupled galvanically both from the input part and also from the output part of the transformer, in the feedback circuit for controlling the transformer, cost-intensive decoupling elements, e.g., optocouplers, can be eliminated.

Below, an example control of the transformer is explained by means of a feedback loop.

The auxiliary electrode of the transformer forms an auxiliary output. The ratio of the voltage picked up at the auxiliary output to the input voltage is designated below as a transmission coefficient of the transformer. The voltage at the auxiliary output is essentially proportional to the output voltage of the transformer.

The input part of the transformer is connected to a primary path and its output part is connected to a secondary path. The input voltage to be applied to the input part of the transformer is supplied by an HF generator, which can include a circuit with an oscillator arranged in the primary path, a driver, and one or more switches. The driver is used, e.g., for controlling the switch. The oscillator can be, in particular, a voltage-controlled oscillator. The oscillator is connected, e.g., via the driver, to the switch or the switches.

Between the auxiliary output and a driver input of the HF generator there is a feedback path with a feedback circuit arranged in this path. The feedback path in one advantageous variant can be decoupled galvanically both from the primary part and also from the secondary part. The feedback circuit can include, e.g., a comparator, an amplifier, and/or other elements for processing a feedback signal picked up at the auxiliary electrode to form a control signal, which is fed to the driver input of the HF generator and controls the oscillator of the HF generator, whereby, in particular, the frequency of the oscillator can be set.

By adapting the frequency of the input voltage, it is possible, in particular, to keep the output voltage of the transformer constant. This is possible with the help of the feedback loop, wherein, in one variant, the frequency-dependent transmission coefficient of the transformer can be influenced by the frequency of the input voltage.

The specified piezoelectric transformer preferably has a resonance characteristic, i.e., its transmission coefficient is characterized by a resonance curve. The operating point of the transformer can be selected, e.g., at the left or right flank of its resonance curve, that is, below or above its resonance frequency.

If a deviation of the voltage from the operating point is determined at the auxiliary output of the transformer, this voltage difference is processed by means of the feedback circuit to form a control signal for controlling the driver of the HF generator, wherein the frequency of the input voltage is changed so as to counteract the voltage deviation. In this way, the operating point of the transformer is shifted. For example, in order to compensate a voltage drop in the output voltage, the frequency of the input signal must be decreased somewhat if the operating point lies above the resonance frequency of the transformer. Thus, a higher transmission coefficient is set and a higher output voltage is achieved. Conversely, the frequency of the input signal must be increased somewhat if the operating point lies below the resonance frequency of the transformer.

The signal picked up at the auxiliary electrode can be used not only for setting the generator frequency, but also, on the other hand, preferably as a control signal for setting the desired or required input voltage.

The length and/or width of the auxiliary electrode can be selected equal to the corresponding dimension of an internal electrode of the input or output part opposite this auxiliary electrode. The length and/or width of the auxiliary electrode can also be smaller or larger than the corresponding dimension of this internal electrode.

It is advantageous if at least one edge of the auxiliary electrode reaches up to the surface of the base body for the purpose of contacting an auxiliary contact. An inner auxiliary electrode can be large enough, in one variant, such that two of its edges or all of its edges reach up to the surface of the base body.

The auxiliary contact can be arranged on the end face. The auxiliary contact can be restricted to the end face of the base body, wherein it preferably forms the auxiliary electrode. The auxiliary contact can also have a cap-shaped construction, wherein it preferably completely covers the end face of the base body and wherein it has areas are arranged on the side surfaces and the main surfaces of the base body.

The base body can have, e.g., a cuboid shape or, especially for a transformer operating with thickness oscillations, a cylindrical shape. For the cylindrical construction, the internal electrodes can be arranged perpendicular to the cylindrical axis oriented parallel to the polarization axis. The auxiliary electrode or the auxiliary contact connected to an inner auxiliary electrode can be arranged advantageously on an end face of the cylindrical base body.

The base body can be flat in one advantageous variant, wherein its thickness is significantly smaller (e.g., by at least a factor of four) than its length and width.

The input contacts, the output contacts, and the at least one auxiliary contact can all be arranged on the side surfaces of the base body. The input contacts are here arranged preferably on opposing first surfaces of the base body. The output contacts are also preferably arranged on opposing first surfaces of the base body. At least one part of the one or more auxiliary contacts can be arranged on at least one second surface of the base body lying perpendicular to the first surfaces.

The first surfaces are preferably first side surfaces of the base body. The second surface can be, e.g., a second side surface or a main surface of the base body.

The arrangement of the auxiliary electrode in a terminal of the base body, especially an end-face part, is considered especially advantageous. Here, the input part is preferably arranged between the auxiliary electrode and the output part. However, it is also possible to arrange the output part between the auxiliary electrode and the input part.

The auxiliary electrode can also be arranged in an insulating part that mechanically connects the input part and the output part of the transformer to each other. In principle, it is possible to arrange the auxiliary electrode between two parts of the input part or output part of the transformer, wherein it is galvanically separated from these two parts.

Instead of only one auxiliary electrode, several such electrodes that are connected to each other galvanically and preferably follow one after the other can also be provided. However, it is also possible to form auxiliary electrodes that are separated from each other galvanically and that are arranged in different parts of the base body. For example, an auxiliary electrode arranged in the region of the input part can be provided for monitoring the input part, and another auxiliary electrode arranged in the region of the output part can be provided for monitoring the output part.

The input part is preferably separated galvanically from the output part. However, it is also possible for the two transformer parts to have, e.g., a common ground contact.

Below, the transformer and the method for its production will be explained in more detail with reference to embodiments and the associated figures. Shown schematically are, in a perspective view:

DESCRIPTION OF THE DRAWINGS

Here, the same reference symbols are used for the same parts or parts with equivalent or similar functions. The representations are not true to scale.

DETAILED DESCRIPTION

Figure 1:
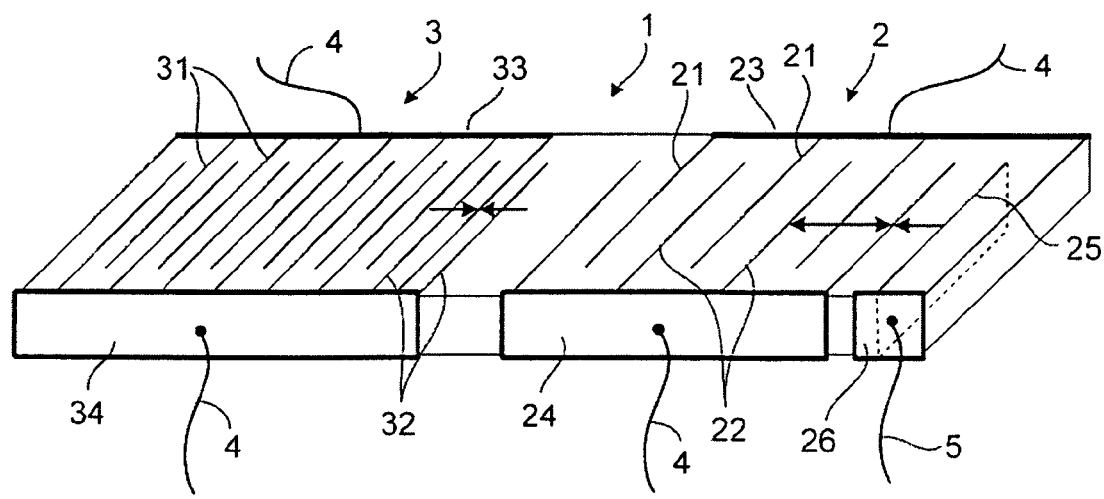
FIG. 1, an example transformer with an auxiliary contact arranged on its side surface.

FIG. 1 shows a piezoelectric transformer with a flat base body that is made from two parts, a primary part (input part), and a secondary part (output part). The two parts are mechanically connected to each other. Preferably, the input part, output part, and insulation part are connected to each other integrally. For example, this is possible by stacking ceramic green films with internal electrodes sandwiched between them and by subsequent sintering of the stack, whereby a monolithic component is produced. An electric signal is converted in the input part into mechanical oscillations of the transformer body by means of the inverse piezoelectric effect. The mechanical oscillations propagate through the body of the transformer and reach the secondary side of the transformer, where they are converted back into an electrical signal by means of the direct piezoelectric effect. Preferably, both the input part and the output part are made from several layers of piezoelectric ceramic that are separated from each other by internal electrodes. The ceramic layers are here preferably connected electrically in parallel.

For the galvanic separation between the input side and the output side of the transformer, a layer made from insulating material (insulating part) is arranged between the two sides. This layer can be made, for example, from the same piezoelectric material as the other parts of the transformer. This layer can include several ceramic sub-layers stacked one above the other.

FIG. 1 shows a transformer with a transformer body, which has an input part 2 and an output part 3. The two parts 2, 3 are connected by means of an insulating part 1. The input part 2 is provided with electrodes 21 of a first type and with electrodes 22 of a second type. These electrodes 21, 22 form electrode structures that engage in each other and with whose help electric fields can be generated in the interior of the input part 2. The electrodes 21 of the first type are electrically connected to the external contact 23. The electrodes 22 of the second type are contacted with the external contact 24. In a similar way, in the output part 3 of the transformer, two groups of electrodes 31 and 32 are provided that are used for picking up an electrical voltage, wherein the electrical voltage is implemented by the external contact 33 connected to the electrodes 31 or by the external contact 34 connected to the electrodes 32.

In the end-face part of the base body, an auxiliary electrode 25, which is connected to an auxiliary contact 26, is arranged in the edge region of the input part. In the variant shown in FIG. 1, the auxiliary electrode is formed with the same length and width as the internal electrodes 22 of the input part. The auxiliary electrode 25 is galvanically separated from the external contacts 23, 24, 33, and 34.

The external contacts 23 and 24 of the input part are arranged on opposing side surfaces of the base body. This also applies to the external contacts 33 and 34 of the output part. The external contacts 24, 34 and the auxiliary contact 26 are arranged on the same surface of the base body, here the front side surface. In this way, the main surfaces and the end faces of the base body are preferably free from metallization.

The electrical contacts 23, 24, 33, 34, and 26 of the transformer are contacted by means of the connection wires 4, 5.

Figure 2:
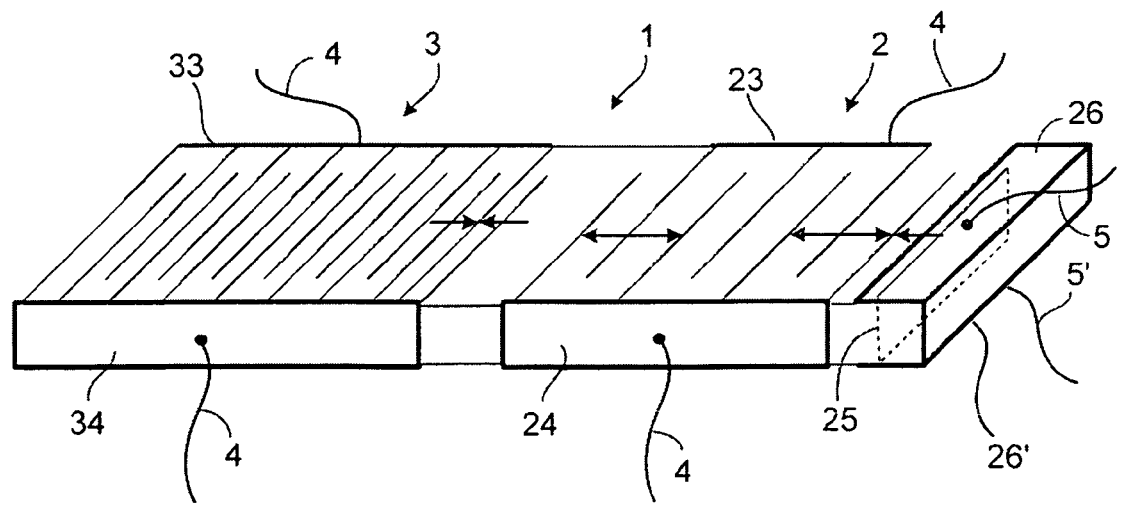
FIG. 2, a transformer with auxiliary contacts arranged on its main surfaces.

In the variant according to FIG. 2, the auxiliary electrode 25 is shorter than the internal electrodes of the input or output part. The auxiliary electrode is connected to a first auxiliary contact 26 arranged on a first main surface of the base body and also to a second auxiliary contact 26' arranged on its second main surface. Here, the end faces of the base body are preferably kept free from metallization. The contact 26' is contacted by means of a connection wire 5'.

Figure 3:
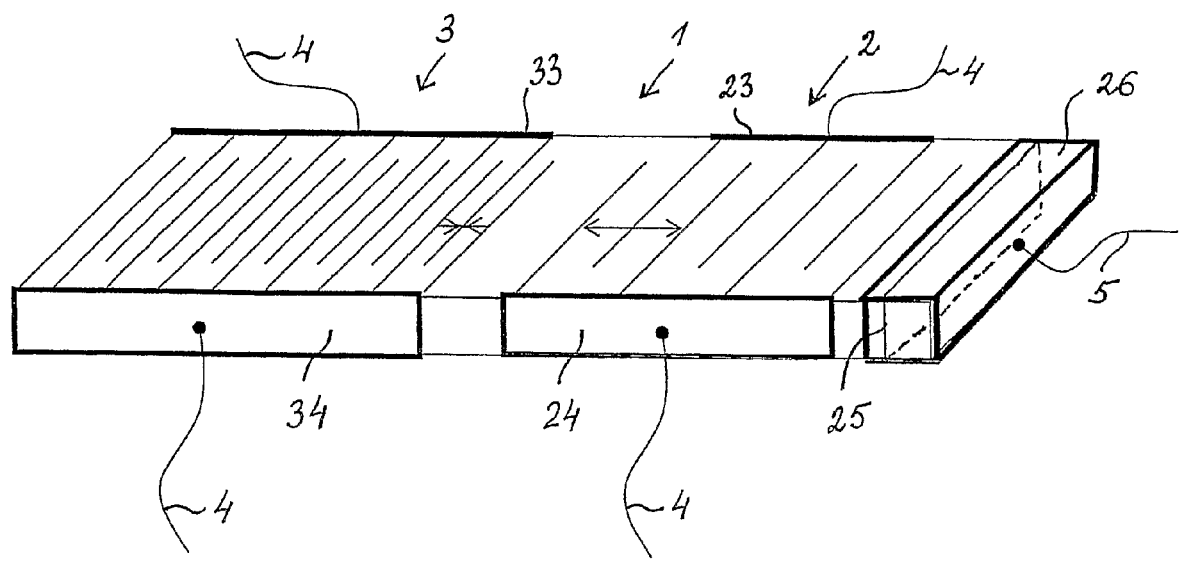
FIG. 3, a transformer with an auxiliary contact arranged on its end face.

In the variant according to FIG. 3, the auxiliary electrode 25 is longer than the internal electrodes of the input or output part. It is connected to a cap-shaped auxiliary contact 26.

Such a contact has the advantage that this makes available an especially large soldering surface for soldering the connection wire 5.

In a piezoelectric transformer with an auxiliary contact formed on the end side of the base body, like, e.g., in the variant according to FIG. 3, an auxiliary electrode 25 lying inside the base body can be eliminated, because such an auxiliary contact is used itself as an auxiliary electrode.

The specified transformer is not limited to the embodiments presented in the figures, the form, or the number of elements shown schematically.

The invention claimed is:

1. A piezoelectric transformer, comprising:
a base body comprising:
an input part;
an output part mechanically connected to the input part, and
internal electrodes perpendicular to a polarization axis of the transformer, the internal electrodes being in the input part and the output part;
an auxiliary electrode galvanically separated from the input part and the output part wherein at least one part of the auxiliary electrode is parallel to the internal electrodes of the input part and the output part.

2. The transformer of claim 1, wherein the at least one part of the auxiliary electrode is in the base body.

3. The transformer of claim 1, wherein the at least one part of the auxiliary electrode is on a surface of the base body.

4. The transformer of claim 1, wherein:
the internal electrodes of the input part are electrically connected to external contacts of the input part, the external contacts being accessible from the outside,
the internal electrodes of the output part are connected to external contacts of the output part, the external contacts being accessible from the outside, and
the auxiliary electrode is conductively connected to at least one auxiliary contact of the transformer accessible from the outside.

5. The transformer of claim 4, wherein the external contacts of the input part, the external contacts of the output part, and the at least one auxiliary contact are on a side surface of the base body.

6. The transformer of claim 4, wherein:
the external contacts of the input part and the external contacts of the output part are on opposing first surfaces of the base body, and
at least one part of the one or more auxiliary contacts is on a second surface of the base body perpendicular to the first surfaces.

7. The transformer of claim 6, wherein:
the first surfaces are side surfaces of the base body, and
the second surface is an end face of the base body.

8. The transformer of claim 6, wherein:
the first surfaces are side surfaces of the base body, and
the second surface is a main surface of the base body.

9. The transformer of claim 1, wherein the polarization axis of the transformer is along a longitudinal axis of the base body.

10. The transformer of claim 1, wherein the polarization axis of the transformer is in a thickness direction of the base body.

11. The transformer of claim 1, wherein the input part is between the at least one auxiliary electrode and the output part.

12. The transformer of claim 1, further comprising:
an insulating part connecting the input part and the output part;
wherein the at least one auxiliary electrode is in the insulating part.

13. The transformer of claim 1, wherein the at least one auxiliary electrode is in a region of the input part.

14. The transformer of claim 1, wherein the at least one auxiliary electrode is in a region of the output part.

15. The transformer of claim 1, wherein at least a part of the auxiliary electrode is perpendicular to main surfaces of the base body.

16. The transformer of claim 1, further comprising one or more additional auxiliary electrodes galvanically connected to each other.

17. The transformer of claim 16, wherein the auxiliary electrodes are one after the other.

* * * * *

UNITED STATES PATENT AND TRADEMARK OFFICE
CERTIFICATE OF CORRECTION

PATENT NO. : 7,723,902 B2 Page 1 of 1
APPLICATION NO. : 12/089076
DATED : May 25, 2010
INVENTOR(S) : Heinz Florian et al.

It is certified that error appears in the above-identified patent and that said Letters Patent is hereby corrected as shown below:

On the Title page of the patent, in the list of References Cited, please replace the second entry under "Foreign Patent Documents" with the following amended version:

JP ~~168185~~ 11-68185 ~~7/1989~~ 3/1999

Signed and Sealed this

Thirty-first Day of August, 2010

David J. Kappos
*Director of the United States Patent and Trademark Office*